(12) United States Patent
Chen

(10) Patent No.: US 12,084,756 B2
(45) Date of Patent: Sep. 10, 2024

(54) CARRIER COMPONENT AND COATING DEVELOPER DEVICE

(71) Applicant: CHANGXIN MEMORY TECHNOLOGIES, INC., Hefei (CN)

(72) Inventor: Buxiang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 521 days.

(21) Appl. No.: 17/400,508

(22) Filed: Aug. 12, 2021

(65) Prior Publication Data

US 2022/0136099 A1 May 5, 2022

Related U.S. Application Data

(63) Continuation of application No. PCT/CN2021/096856, filed on May 28, 2021.

(30) Foreign Application Priority Data

Nov. 2, 2020 (CN) .......................... 202011204344.6

(51) Int. Cl.
  *C23C 14/50* (2006.01)
  *B05C 13/00* (2006.01)
  *H01L 21/67* (2006.01)

(52) U.S. Cl.
  CPC ............ *C23C 14/505* (2013.01); *B05C 13/00* (2013.01); *H01L 21/6715* (2013.01)

(58) Field of Classification Search
  CPC ......... C23C 14/50–505; H01L 21/683–68792; B05C 13/00
  See application file for complete search history.

(56) References Cited

U.S. PATENT DOCUMENTS

| | | | | |
|---|---|---|---|---|
| 5,300,175 A | * | 4/1994 | Gardner | .............. H01L 21/6838 156/286 |
| 6,446,948 B1 | * | 9/2002 | Allen | .................... B25B 11/005 269/21 |
| 2010/0022094 A1 | * | 1/2010 | Kim | .................. H01L 21/68742 414/222.01 |

FOREIGN PATENT DOCUMENTS

| | | | |
|---|---|---|---|
| CN | 110955117 A | | 4/2020 |
| KR | 20090029407 | * | 3/2009 |

OTHER PUBLICATIONS

Kim et al. translation (Year: 2009).*

* cited by examiner

*Primary Examiner* — Dah-Wei D. Yuan
*Assistant Examiner* — Stephen A Kitt
(74) *Attorney, Agent, or Firm* — Kilpatrick Townsend & Stockton LLP

(57) ABSTRACT

Provided are a carrier component and a coating developer device. The carrier component includes a supporting pillar, a first carrier stage and a second carrier stage that is provided with an accommodating cavity and a through mounting hole in communication with the accommodating cavity and includes at least two casings which are assembled to form the through mounting hole matched with the supporting pillar and the accommodating cavity surrounding the first carrier stage; and the at least two casings are detachably connected to one another.

20 Claims, 6 Drawing Sheets

CARRIER COMPONENT AND COATING DEVELOPER DEVICE

CROSS-REFERENCE TO RELATED APPLICATION

This is a continuation application of International Patent Application No. PCT/CN2021/096856, filed on May 28, 2021, which claims priority to Chinese patent application No. 202011204344.6, filed on Nov. 2, 2020 and entitled "Carrier Component and Coating Developer Device". The disclosures of International Patent Application No. PCT/CN2021/096856 and Chinese patent application No. 202011204344.6 are incorporated by reference herein in their entireties.

TECHNICAL FIELD

The present disclosure relates to the technical field of semiconductor manufacturing equipment, in particular, a carrier component and a coating developer device.

BACKGROUND

In a semiconductor manufacturing process, desired patterns are formed on the surfaces of wafers after the wafers usually undergo processes such as pretreatment, coating, exposure, development, and etching for subsequent formation of integrated circuit structures. The wafer usually needs to be fixed in the above process to ensure the quality of the formed pattern. For example, in a coating or developing process, the wafer is placed on a carrier component, and the carrier component drives the wafer to rotate. Photoresist or developing liquid can be uniformly coated on the surface of the wafer to complete the coating or developing process.

The carrier component usually includes a carrier stage and a driving device, and the wafer is placed on the carrier stage and relatively fixed with the carrier stage. The driving device includes a motor. The motor drives the carrier stage to rotate, so that the wafer on the carrier stage rotates synchronously to perform the coating or developing process. The carrier stage will be abraded or damaged if it works for a long time, and the damaged carrier stage will affect the yield of wafers. Therefore, it is necessary to remove the damaged carrier stage and replace it with a new one. However, it takes a long time to stop the machine to remove the damaged carrier stage and replace it with a new one, resulting in a decrease in wafer production efficiency.

SUMMARY

In view of the above-mentioned problems, the present disclosure provides a carrier component and a coating developer device used to improve the production efficiency of wafers.

In order to achieve the above objective, the present disclosure provides the following technical solutions.

In a first aspect, the present disclosure provides a carrier component, including a supporting pillar, a first carrier stage fixedly mounted on the supporting pillar, and a second carrier stage fixedly mounted on the supporting pillar and located outside the first carrier stage. The second carrier stage is provided with an accommodating cavity and a through mounting hole in communication with the accommodating cavity; the second carrier stage includes at least two casings; the at least two casings are assembled to form the through mounting hole matched with the supporting pillar and the accommodating cavity surrounding the first carrier stage; and the at least two casings are detachably connected to one other.

In a second aspect, the present disclosure further provides a coating developer device, including the above-mentioned carrier component, a driving device connected with the carrier component and used to drive the carrier component, and a vacuumizing device in communication with the first suction port and the second suction port of the carrier component.

DETAILED DESCRIPTION

Figure 1:
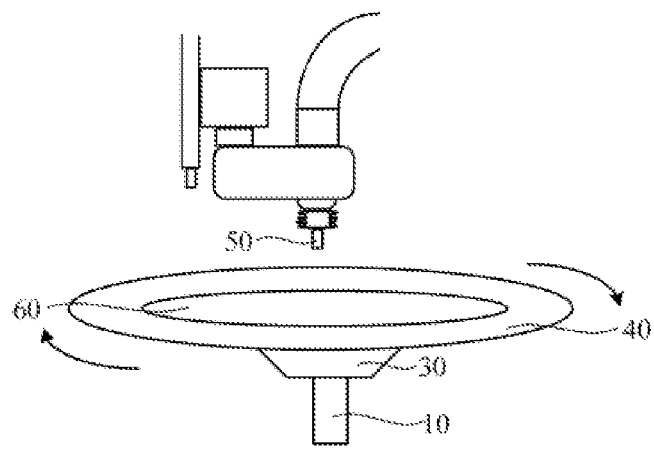
FIG. 1 is a schematic view of a coating process in the embodiments of the present disclosure.

A carrier component provided by the present disclosure includes a supporting pillar, a first carrier stage and a second carrier stage. The first carrier stage and the second carrier stage are fixedly mounted on the supporting pillar respectively. The first carrier stage is located in an accommodating cavity of the second carrier stage. The second carrier stage is provided with a through mounting hole that is matched with the supporting pillar and is in communication with the accommodating cavity. The second carrier stage is formed by assembling at least two casings, and these casings are detachably connected to one another. These casings are assembled to form the through mounting hole, so that the second carrier stage surrounds the first carrier stage and is mounted on the supporting pillar. When the second carrier stage is damaged, the second carrier stage can be disassembled to separate the at least two casings from one another without removing the first carrier stage, so that the first carrier stage is exposed to carry the wafer. Therefore, the time of installing the first carrier stage is saved, the downtime for replacing the carrier component is reduced, and the production efficiency of wafers is improved. In addition, when the second carrier stage is damaged, the second carrier stage can be assembled outside the first carrier stage to carry the wafer without removing the first carrier stage, so that the time of removing the first carrier stage is saved, the downtime for replacing the carrier component is reduced, and the production efficiency of wafers is further improved.

In order to make the objectives, features and advantages of the present disclosure clearer, the technical solutions in the embodiments of the present disclosure are described clearly and completely below in conjunction with the drawings in the embodiments of the present disclosure. Apparently, the described embodiments are merely a part of the embodiments of the present disclosure and not all the embodiments. Based on the embodiments in present disclosure, all other embodiments obtained by those of ordinary skill in the art without creative work shall fall within the protection scope of the present disclosure.

In a semiconductor production process, an integrated circuit is usually formed on a wafer through a thin film process, a graphical process, a doping process, a thermal treatment process, etc. The graphical process transfers a pattern on a mask plate onto the wafer, and mainly includes pretreatment, coating, soft baking, exposure, development, hard baking, etching, peeling, etc.

In the graphical process, a coating developer device (also called Track) and a scanner are used cooperatively. The coating developer device is used to form a photoresist film on the surface of a wafer and remove part of the photoresist film to develop a pattern, thereby transferring the pattern on the mask plate onto the photoresist film. The scanner exposes the photoresist film through the mask plate to change the nature of the photoresist film. The exposed photoresist film includes a soluble region that can be removed by developing liquid and a non-soluble region that cannot be removed by developing liquid.

The coating developer device usually includes a nozzle, a carrier component and a driving device. The nozzle is opposite to the carrier component, and the nozzle is connected with a photoresist storage device or a developing liquid storage device, and is used to spray photoresist or developing liquid. There may be a plurality of nozzles. Some of the nozzles are connected to the photoresist storage device, and the other of the nozzles are connected to the developing liquid storage device to avoid mutual interference between the photoresist and the developing liquid.

The driving device drives the carrier component to move. Specifically, the driving device drives the carrier component to move, so that the carrier component and the nozzle are opposite and have a certain distance. The driving device further drives the carrier component to rotate to enable the wafer on the carrier component to synchronously rotate. The driving device may be a servo motor. An output shaft of the servo motor may be connected with the carrier component through a shaft coupler to drive the carrier component to move.

The carrier component is used to place and fix the wafer, so that the wafer and the carrier component move synchronously. The carrier component can fix the wafer on the carrier component by a clamping head, vacuum suction or electrostatic suction. In the embodiments of the present disclosure, the carrier component fixes the wafer by vacuum suction.

In the embodiments of the present disclosure, the end of the carrier component configured to place the wafer is provided with a suction port. The suction port may be a plurality of suction holes, suction slots or suction rings. A vacuum portion is arranged in the carrier component; one end of the vacuum portion is in communication with the suction port, and the other end of the vacuum portion is in communication with the vacuumizing device. For example, the other end of the vacuum portion is connected with a vacuum pump.

Referring to FIG. 1, a coating process is taken as an example. When the wafer 40 is placed on the carrier component and covers the suction port, the vacuum pump vacuumizes the vacuum portion of the carrier component into a vacuum state. The wafer 40 is pressed on the carrier component under the action of atmospheric pressure to enable the wafer 40 to be fixed with respect to the carrier component. Then, the position of the carrier component relative to the nozzle 50 is adjusted through the driving device to have a preset distance between the wafer 40 on the carrier component and the nozzle 50.

In some examples, the driving device drives the carrier component to rotate, so that the wafer 40 on the carrier component to synchronously rotate with the carrier component. The nozzle 50 sprays the photoresist 60 to the surface of the wafer 40. As the wafer 40 rotates, the photoresist 60 is uniformly coated on the wafer from the center of the wafer 40 to the edge of the wafer 40, and finally the photoresist 60 is formed on the whole surface of the wafer 40 to complete the coating process.

It should be noted that in the coating process, when the carrier component is stationary, the photoresist 60 can also be sprayed to the surface of the wafer 40 through the nozzle 50; then, the carrier component is driven by the driving device to rotate, so that the wafer 40 on the carrier component synchronously rotates with the carrier component, and the photoresist 60 in the center region of the wafer 40 is coated on the whole surface of the wafer 40 under the action of a centrifugal force.

Figure 2:
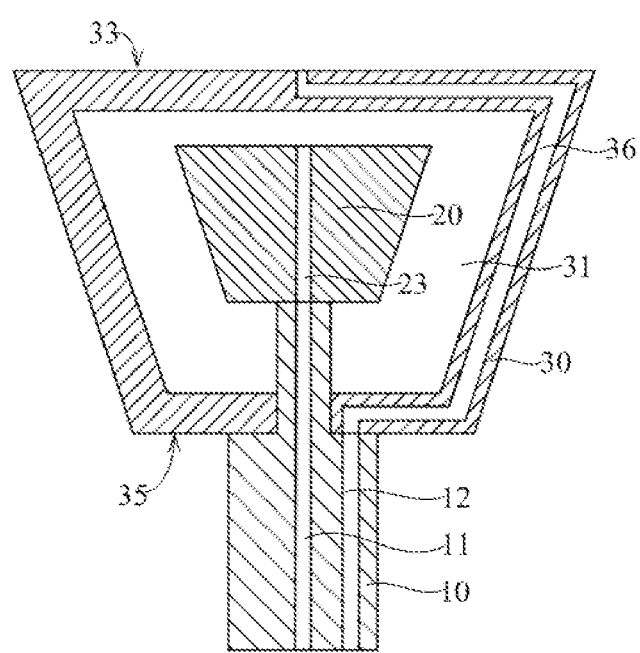
FIG. 2 is a schematic view of a carrier component in the embodiments of the present disclosure.

Referring to FIG. 2, the carrier component in the embodiments of the present disclosure includes a supporting pillar 10, a first carrier stage 20 and a second carrier stage 30. The first carrier stage 20 and the second carrier stage 30 are fixedly connected with the supporting pillar 10 respectively, so that the first carrier stage 20 and the second carrier stage 30 can synchronously move with the supporting pillar 10.

It should be noted that the first carrier stage 20 and the supporting pillar 10 are detachably connected to each other, and the second carrier stage 30 and the supporting pillar 10 are detachably connected to each other. As such, when the first carrier stage 20 or the second carrier stage 30 is damaged, the first carrier stage 20 or the second carrier stage 30 can be replaced to prolong the service life of the carrier component.

One end of the supporting pillar 10 is connected with the driving device. In the orientation as shown in FIG. 2, the lower end of the supporting pillar 10 is connected with the driving device, and the driving device drives the supporting pillar 10 to move in a horizontal direction, move in a vertical direction or rotate. The other end of the supporting pillar 10 may be connected with the first carrier stage 20. In the orientation as shown in FIG. 2, the upper end of the supporting pillar 10 is connected with the first carrier stage 20. The supporting pillar 10 may be connected with the second carrier stage 30. As shown in FIG. 2, the middle part of the supporting pillar 10 is connected with the second carrier stage 30.

The supporting pillar 10 is generally columnar. The supporting pillar 10 may be cylindrical, elliptical or prismatic. In the embodiments of the present disclosure, the supporting pillar 10 is cylindrical to facilitate machining and manufacturing of the supporting pillar 10 and to facilitate the connection between the supporting pillar 10 and the driving device. The axis of the supporting pillar 10 may coincide with a rotation axis of the supporting pillar 10, so that the supporting pillar 10 rotates around its own axis during rotation to improve the rotation stability of the supporting pillar 10.

It can be understood that the cylindrical supporting pillar 10 means that the section of the supporting pillar 10 in a plane perpendicular to the axial direction of the supporting pillar 10 is circular. The diameter of each section of the supporting pillar 10 may be the same or different.

For example, in the case that the diameter of each section of the supporting pillar 10 is the same, the supporting pillar 10 is a cylinder. In the case that the diameter of each section of the supporting pillar 10 decreases in turn along the axial direction of the supporting pillar 10 away from the driving device, the supporting pillar 10 is a truncated cone.

In the embodiments of the present disclosure, the supporting pillar 10 is a stepped cylinder, that is, the supporting pillar 10 includes a first cylinder 13 and a second cylinder 14 connected with the first cylinder 13. One end of the first cylinder 13 is connected with the first carrier stage 20, and the other end of the first cylinder 13 is connected with one end of the second cylinder 14. The other end of the second cylinder 14 is connected with the driving device.

It should be noted that the first cylinder 13 may be formed in one piece with the second cylinder 14, that is, the first cylinder 13 and the second cylinder 14 are formed by machining one cylinder. The first cylinder 13 and the second cylinder 14 may also be separated elements, that is, the first cylinder 13 and the second cylinder 14 are connected together after being formed by machining respectively.

For example, the end surface of the cylinder having a larger diameter from among the first cylinder 13 and the second cylinder 14 is provided with a connection hole or a thread hole, and the end part of the cylinder having a smaller diameter from among the first cylinder 13 and the second cylinder 14 cooperates with the hole, that is, the first cylinder 13 and the second cylinder 14 are fixed by means of interference fit or threaded connection.

Continuously referring to FIG. 2, the upper end of the first cylinder 13 is connected with the first carrier stage 20, and the lower end of the first cylinder 13 is connected with the upper end of the second cylinder 14. The lower end of the second cylinder 14 is connected with the driving device. In the embodiments of the present disclosure, the diameter of the first cylinder 13 is different from the diameter of the second cylinder 14, so that a step surface 15 is formed between the first cylinder 13 and the second cylinder 14. The step surface 15 may be configured for positioning the second carrier stage 30, that is, one end of the second carrier stage 30 is in contact with the step surface 15, so that the second carrier stage 30 may bear against the step surface 15.

For example, the diameter of the first cylinder 13 is smaller than the diameter of the second cylinder 14. The step surface 15 formed between the first cylinder 13 and the second cylinder 14 faces towards the first cylinder 13. As such, the shake of the second cylinder 14 during operation can be alleviated, and the good stabilization performance of the supporting pillar 10 can be achieved.

In the embodiments of the present disclosure, the axis of the first cylinder 13, the axis of the second cylinder 14, and the rotation axis of the supporting pillar 10 coincide with each other to further reduce the shake of the first cylinder 13 and the second cylinder 14, thereby further improving the stabilization performance of the supporting pillar 10.

Figure 3:
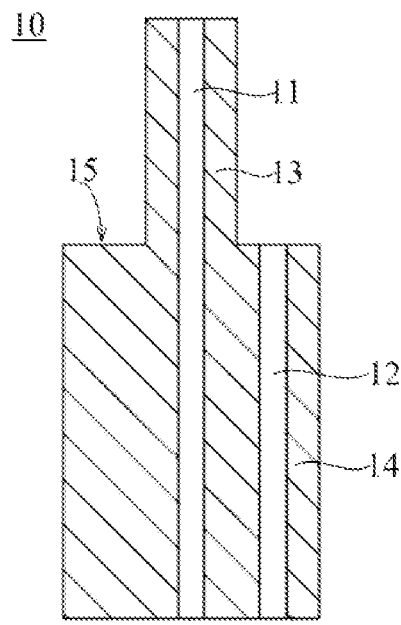
FIG. 3 is a schematic view of a supporting pillar in the embodiments of the present disclosure.

A first conduit 11 and a second conduit 12 are also arranged in the supporting pillar 10. The first conduit 11 and a second conduit 12 are a part of the vacuum portion of the carrier component. The first conduit 11 and a second conduit 12 may be not communicated with each other. As shown in FIG. 3, the first conduit 11 is arranged at a center position of the supporting pillar 10, and the second conduit 12 is arranged at the edge position of the supporting pillar 10.

For example, the first conduit 11 is a straight through hole that passes through the first cylinder 13 and the second cylinder 14. Referring to FIG. 3, the axis of the first conduit 11 may coincide with the axis of the supporting pillar 10, that is, the first conduit 11 extends through the entire supporting pillar 10 along the axial direction of the supporting pillar 10.

One end of the first conduit 11 is arranged at an end of the first cylinder 13 away from the second cylinder 14, and the other end of the first conduit 11 is arranged at an end of the second cylinder 14 away from the first cylinder 13. As shown in FIG. 3, one end of the first conduit 11 is arranged at the upper end of the first cylinder 13, and the other end of the first conduit 11 is arranged at the lower end of the second cylinder 14.

The second conduit 12 may be a straight through hole passing through the second cylinder 14. Referring to FIG. 3, one end of the second conduit 12 is disposed on the step surface 15 formed by the first cylinder 13 and the second cylinder 14, and the other end of the second conduit 12 is arranged at an end of the second cylinder 14 away from the first cylinder 13. As shown in FIG. 3, the second conduit 12 is a straight through hole passing through the upper and lower ends of the second cylinder 14.

Continuously referring to FIG. 2, the supporting pillar 10 is fixedly connected with the first carrier stage 20. For example, a first carrier stage 20 is mounted at an end of the supporting pillar 10 away from the driving device, and the supporting pillar 10 and the first carrier stage 20 may be in threaded connection.

Figure 4:
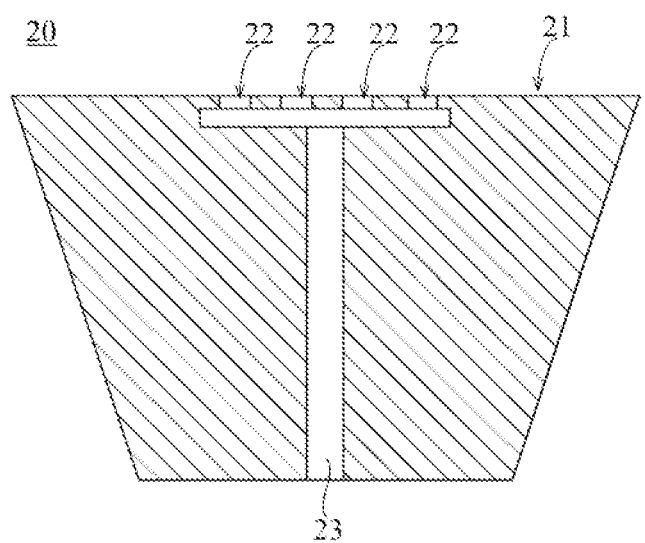
FIG. 4 is a schematic view of a first carrier stage in the embodiments of the present disclosure.

Among two opposite ends of the first carrier stage 20, one end is the carrying end 21 of the first carrier stage, and the other end is in contact with the supporting pillar 10. As shown in FIG. 4, the upper end of the first carrier stage 20 is the carrying end 21 of the first carrier stage on which the wafer 40 is placed and fixed. The lower end of the first carrier stage 20 is in contact with the supporting pillar 10.

Figure 5:
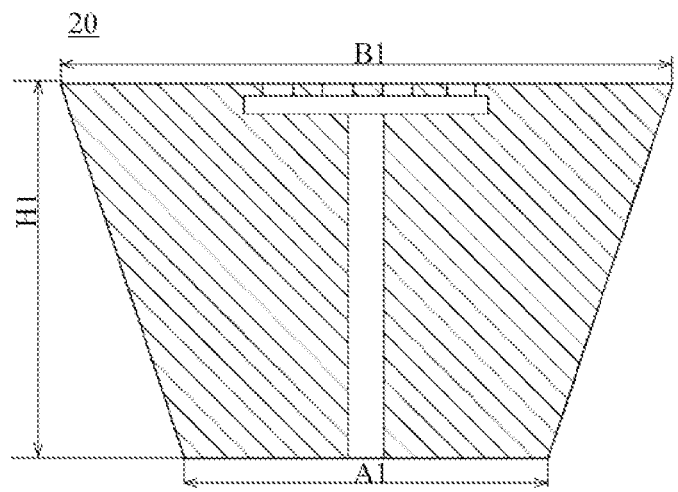
FIG. 5 is a view showing size of a first carrier stage in the embodiments of the present disclosure.

The first carrier stage 20 may be in a shape of a truncated cone. The first carrier stage comprises a third end that has a third diameter, and a fourth end that has a fourth diameter smaller than the third diameter. The third end of the first carrier stage is also referred to as a large end of the first carrier stage, and the fourth end of the first carrier stage is also referred to as a small end of the first carrier stage. As shown in FIG. 4 and FIG. 5, the large end of the first carrier stage 20 is the carrying end 21 of the first carrier stage, and the small end of the first carrier stage 20 is in contact with the supporting pillar 10. The third diameter B1 of the large end of the first carrier stage is greater than the fourth diameter A1 of the small end of the first carrier stage. For example, referring to FIG. 5, the third diameter B1 of the large end of the first carrier stage is in a range of 15 to 50 cm, the fourth diameter A1 of the small end of the first carrier stage is in a range of 10 to 45 cm, and the height H1 of the first carrier stage is 30 to 50 cm.

In the above embodiment, the first carrier stage 20 is in a shape of a truncated cone, but it is not limited to this. The first carrier stage 20 can also be in other shapes, such as a cylinder, that is, the diameters of both ends of the first carrier stage 20 are equal, the diameter range of the cylinder may be 15 to 45 cm.

Continuously referring to FIG. 2, the carrying end 21 of the first carrier stage is provided with a first suction port 22, and the number of the first suction port 22 may be one, as shown in FIG. 2. There may also be multiple first suction ports 22. As shown in FIG. 4, the first suction port 22 includes a plurality of porous openings, slotted openings or ring-shaped openings distributed in a center region of the carrying end 21 of the first carrier stage, i.e., the first suction port 22 may include a plurality of suction holes, suction slots or suction rings.

A plurality of suction holes or suction slots may be uniformly distributed around the center of the carrying end 21 of the first carrier stage, and a plurality of suction rings may be sequentially arranged around the center of the carrying end 21 of the first carrier stage at regular intervals. When the wafer 40 is placed at the carrying end 21 of the first carrier stage, the wafer 40 covers the first suction port 22.

A first channel 23 is also provided in the first carrier stage 20, and the first channel 23 is part of the vacuum portion of the carrier component. As shown in FIG. 4, one end of the first channel 23 is in communication with the first suction port 22, and the other end of the first channel 23 is in communication with the first conduit 11 in the supporting pillar 10, so that the first carrier stage 20 can suck the wafer 40. Referring to FIG. 2 to FIG. 4, when the first channel 23 of the first carrier stage 20 and the first conduit 11 of the supporting pillar 10 are vacuumized, the wafer 40 is held on the first suction port 22 and thus fixed on the first carrier stage 20.

Figure 6:
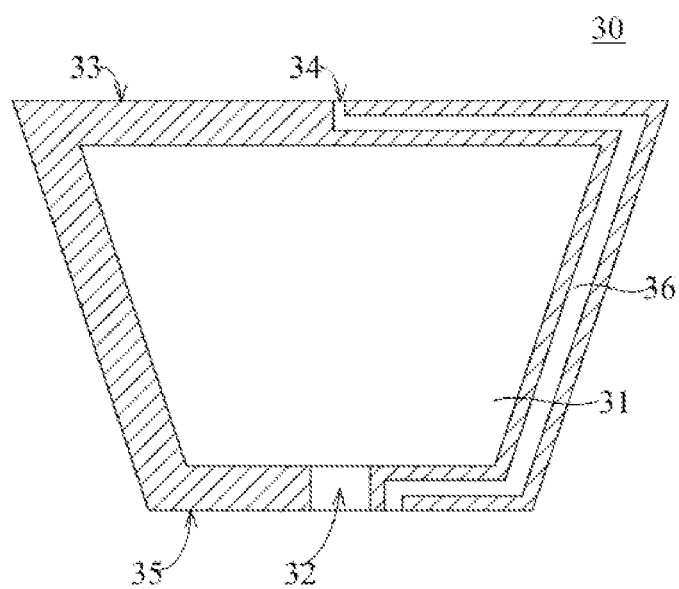
FIG. 6 is a schematic view of a second carrier stage in the embodiments of the present disclosure.

Continuously referring to FIG. 2, the supporting pillar 10 is also fixedly connected with the second carrier stage 30, which surrounds the exterior of the first carrier stage 20. Referring to FIG. 6, an accommodating cavity 31 is arranged inside the second carrier stage 30. One end of the second carrier stage 30 is a connection end 35 of the second carrier stage; the connection end 35 of the second carrier stage is provided with a through mounting hole 32 in communication with the accommodating cavity 31. The through mounting hole 32 is matched with the supporting pillar 10. The other end of the second carrier stage 30 is a carrying end 33 of the second carrier stage, that is, the end opposite to the connection end 35 of the second carrier stage is the carrying end 33 of the second carrier stage. The wafer 40 is placed and fixed on the carrying end 33 of the second carrier stage.

Figure 7:
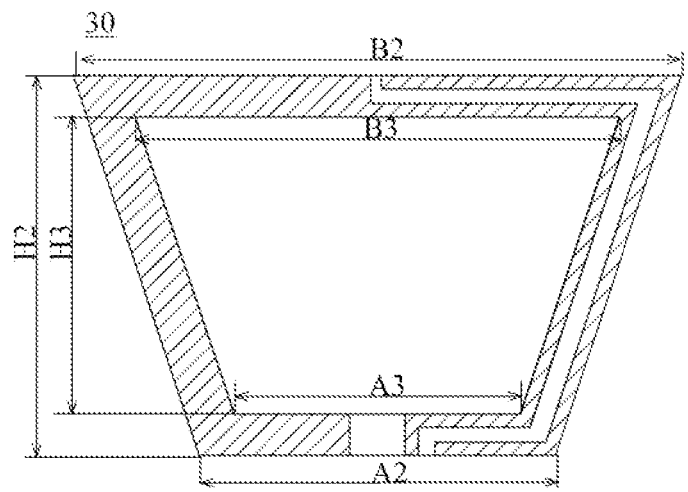
FIG. 7 is a view showing size of a second carrier stage in the embodiments of the present disclosure.

The second carrier stage 30 may be in a shape of a truncated cone. The second carrier stage comprises a first end that has a first diameter, and a second end that has a second diameter smaller than the first diameter. The first end of the second carrier stage is also referred to as a large end of the second carrier stage, and the second end of the second carrier stage is also referred to as a small end of the second carrier stage. Referring to FIG. 6 and FIG. 7, the large end of the second carrier stage 30 is the carrying end 33 of the second carrier stage, and the small end of the second carrier stage 30 is provided with a through mounting hole 32. The first diameter of the large end of the second carrier stage 30 is greater than the second diameter of the small end of the second carrier stage 30. For example, referring to FIG. 7, the first diameter B2 of the large end of the second carrier stage is 40 to 75 cm, the second diameter A2 of the small end of the second carrier stage is 30 to 60 cm, and the height H2 of the second carrier stage is 50 to 80 cm.

The accommodating cavity 31 of the second carrier stage 30 is in a shape of truncated cone. The accommodating cavity comprises a fifth end that has a fifth diameter, and a sixth end that has a sixth diameter smaller than the fifth diameter. The fifth end of the accommodating cavity is also referred to as a large end of the accommodating cavity, and the sixth end of the accommodating cavity is also referred to as a small end of the accommodating cavity. The axis of the accommodating cavity 31, the axis of the second carrier stage 30 and the rotation axis of the second carrier stage 30 may coincide with each other to reduce the eccentricity of the second carrier stage 30. The shape of the accommodating cavity 31 conforms to the shape of the second carrier stage 30, that is, the small end of the accommodating cavity 31 is similar to the small end of the second carrier stage 30, and the large end of the accommodating cavity 31 is similar to the large end of the second carrier stage 30.

For example, referring to FIG. 7, the sixth diameter A3 of the small end of the accommodating cavity is 20 to 55 cm, the fifth diameter B3 of the large end of the accommodating cavity is 30 to 65 cm, and the height H3 of the accommodating cavity is 40 to 60 cm. It can be understood that the height H3 of the accommodating cavity is greater than the height H2 of the first carrier stage, so that the first carrier stage 20 can be placed in the accommodating cavity 31.

After the first carrier stage 20 is mounted on the supporting pillar 10, in order to mount or remove the second carrier stage 30 without removing the first carrier stage 20, the second carrier stage 30 may include at least two casings. These casings can be assembled to form the second carrier stage 30; and after at least two casings are assembled around the supporting pillar 10, the through mounting hole 32 and the accommodating cavity 31 are formed.

It can be understood that the through mounting hole 32 is assembled, and the side walls forming the through mounting hole 32 are distributed on at least part of these casings. After these casings are assembled, the complete through mounting hole 32 is formed. These casings are assembled around the supporting pillar 10 so that the second carrier stage 30 can be assembled outside the supporting pillar 10 and surround the first carrier stage 20.

The at least two casings that are assembled to form the second carrier stage 30 are detachably connected to one another, that is, at least two casings can be assembled to form the second carrier stage 30, and the second carrier stage 30 can also be formed by at least two separate casings. As such, the second carrier stage 30 can be mounted and removed without removing the first carrier stage 20.

It is understandable that at least two casings are assembled along the supporting pillar 10 to form the second carrier stage 30, and the through mounting hole 32 formed by the assembly surrounds the outside of the supporting pillar 10; the second carrier stage 30 is disassembled along the supporting pillar 10 to separate at least two casings, and the at least two casings are separated from the supporting pillar 10 after the disassembly.

At least two casings can be snapped with each other to form the second carrier stage 30 by snapping connection, or at least two casings can be combined to form the second carrier stage 30 and then fixed by a hoop to prevent the second carrier stage 30 from being dismantled. For example, after at least two casings are assembled to form the second carrier stage 30, hoops are mounted around the outer side of the at least two casings to fix these casings. It can be understood that these casings may be positioned by means of cooperation of pins and holes and then are fixed by the hoops.

Figure 8:
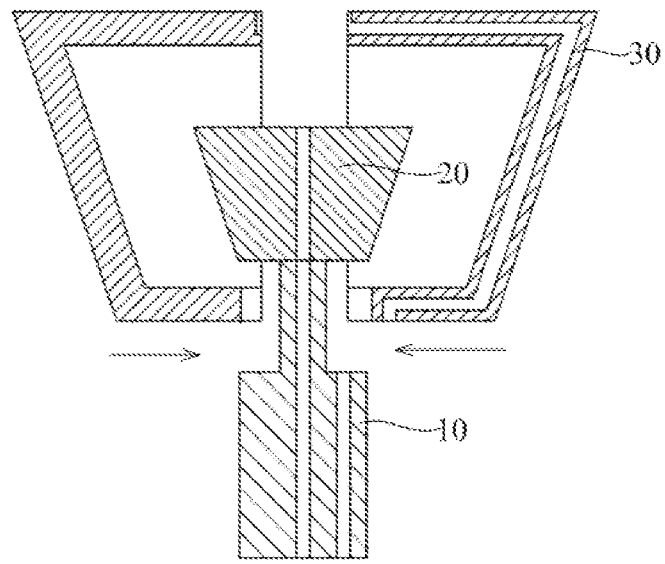
FIG. 8 is one schematic view of a second carrier stage in the embodiments of the present disclosure.

In some possible examples, referring to FIG. 8, the second carrier stage 30 includes two casings, that is, the second carrier stage 30 is formed by assembling the two casings. Each of the two casings is provided with a notch, and the two notches form the through mounting hole 32.

It can be understood that one end of each casing forms the connection end 35 of the second carrier stage 30, the end of each casing is provided with a notch, and the two notches respectively penetrate through one end of the corresponding casing. After the two casings are assembled, the two notches may together form the through mounting hole 32 in communication with the accommodating cavity 31 of the second carrier stage 30.

For example, when the two casings are assembled to form the second carrier stage 30, the notches in the two casings are halves of the through mounting hole 32, so that the two notches can be clamped on the supporting pillar 10 to form the complete through mounting hole 32. That is, the notches in the two casings can form the through mounting holes 32, and after the two notches form the through mounting hole 32, the supporting pillar 10 is located in the through mounting hole 32.

As shown in FIG. 8, the second carrier stage 30 may be divided into two casings along a plane that contains the axis of the second carrier stage 30. That is, the carrying end 33 of the second carrier stage is divided into two semicircles, and the connection end 35 of the second carrier stage is divided into two semicircular rings. That is, the notches of the two casings are symmetric to facilitate assembling and disassembly of the second carrier stage 30.

The two casings of the second carrier stage 30 are mounted in a radial direction of the supporting pillar 10. The two casings of the second carrier stage 30 are mounted in a direction of the arrow as shown in FIG. 8. The two casings of the second carrier stage 30 are disassembled in a direction opposite to the arrow as shown in FIG. 8.

It should be noted that the second carrier stage 30 may also be assembled by three casings. At least two of the three casings are provided with a notch used to form the through mounting hole 32. For example, each of the three casings may be provided with a notch, so that the three casings are mounted and removed in the radial direction of the supporting pillar 10.

In order to realize that the second carrier stage 30 may synchronously move with the supporting pillar 10, in one possible example, the through mounting hole 32 of the second carrier stage 30 is provided with an internal thread, and the supporting pillar 10 is provided with an external thread matching the internal thread, so that the second carrier stage 30 is in threaded connection with the supporting pillar 10.

During installation of the second carrier stage 30, the second carrier stage 30 is assembled at a bare section of the supporting pillar 10 having no thread, and then the second carrier stage 30 is screwed by means of rotating the second carrier stage 30 onto the thread section of the supporting pillar 10.

In one possible example, when the supporting pillar 10 includes the first cylinder 13 and the second cylinder 14, the first carrier stage 20 may be mounted to the end of the first cylinder 13 away from the second cylinder 14, and the second carrier stage 30 may be mounted to the end of the first cylinder 13 adjacent to the second cylinder 14. The first cylinder 13 and the second cylinder 14 form a step surface 15. The step surface 15 faces towards the first cylinder 13. The orientation of the step surface 15 is consistent with the orientations of the carrying end 21 of the first carrier stage and the carrying end 33 of the second carrier stage.

The side wall of the first cylinder 13 in contact with the step surface 15 is provided with an external thread, and the through mounting hole 32 is provided with an internal thread. After the first cylinder 13 is connected to the through mounting hole 32 of the second carrier stage 30, the connection end 35 of the second carrier stage bears against the step surface 15, so that the step surface 15 may support the second carrier stage 30 to improve the reliability of connection between the second carrier stage 30 and the supporting pillar 10.

In another possible example, the step surface 15 and the second carrier stage 30 are connected to one another by means of interference fit between a pin and a pin hole. For example, the step surface 15 is provided with a pin facing towards the second carrier stage 30, and the second carrier stage 30 is provided with a pin hole. The pin hole of the second carrier stage 30 is in interference fit with the pin on the step surface 15, so as to fixedly connect the second carrier stage 30 to the supporting pillar 10.

Referring to FIG. 6, the carrying end 33 of the second carrier stage is also provided with a second suction port 34; a second channel 36 in communication with the second suction port 34 is arranged in the second carrier stage 30; and the second channel 36 is also in communication with the second conduit 12. That is, one end of the second channel 36 is connected with the second suction port 34, and the other end of the second channel 36 is connected with the second conduit 12. As for the structure of the second suction port 34, reference may be made to the structure of the first suction port 22, and, for brevity, will not be discussed in detail.

The second channel 36 is a part of the vacuum portion of the carrier component. In the embodiments of the present disclosure, the first conduit 11 and the second conduit 12 of the supporting pillar 10, the first channel 23 of the first carrier stage 20, and the second channel 36 of the second carrier stage 30 together form the vacuum portion of the carrier component. The wafer 40 can be fixed on the first carrier stage 20 or the second carrier stage 30 by means of vacuumizing the first conduit 11 and the first channel 23 or vacuumizing the second conduit 12 and the second channel 36.

It can be understood that in order to realize a vacuum suction function, the second channel 36 and the accommodating cavity 31 do not communicate with each other, so that the second channel 36 and the second conduit 12 may suck the wafer 40 to the carrying end 33 of the second carrier stage by means of vacuumization.

In order to make the second carrier stage 30 have a good suction effect, the second channel 36 may be disposed in the casing wall of one of the at least two casings. For example, in the case that the second carrier stage 30 includes two casings, the second channel 36 is disposed in the casing wall of one of the casings. It can be understood that even the carrying end 33 of the second carrier stage may not be uniformly divided, the connection end 35 of the second carrier stage may still be uniformly divided, i.e., the notches of the two casings are still symmetric.

Figure 9:
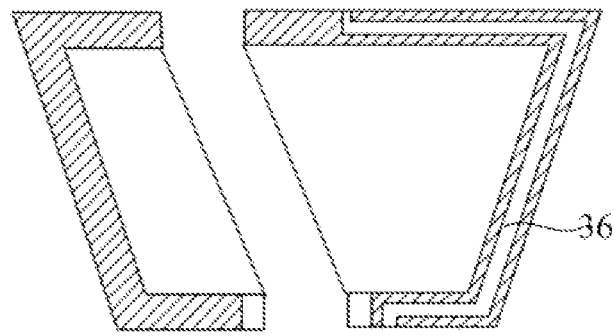
FIG. 9 is another schematic view of a second carrier stage in the embodiments of the present disclosure.

As shown in FIG. 9, the second channel 36 is disposed in the casing wall of the right casing, and the second channel 36 can be formed without assembling the two casings. Compared with forming the second channel 36 by assembling, this configuration can avoid a generation of cracks in the second channel 36 to reduce leakage at the second channel 36, thereby improving the leakproofness of the second channel 36 and forming a good vacuum environment in the second channel 36.

Figure 10:
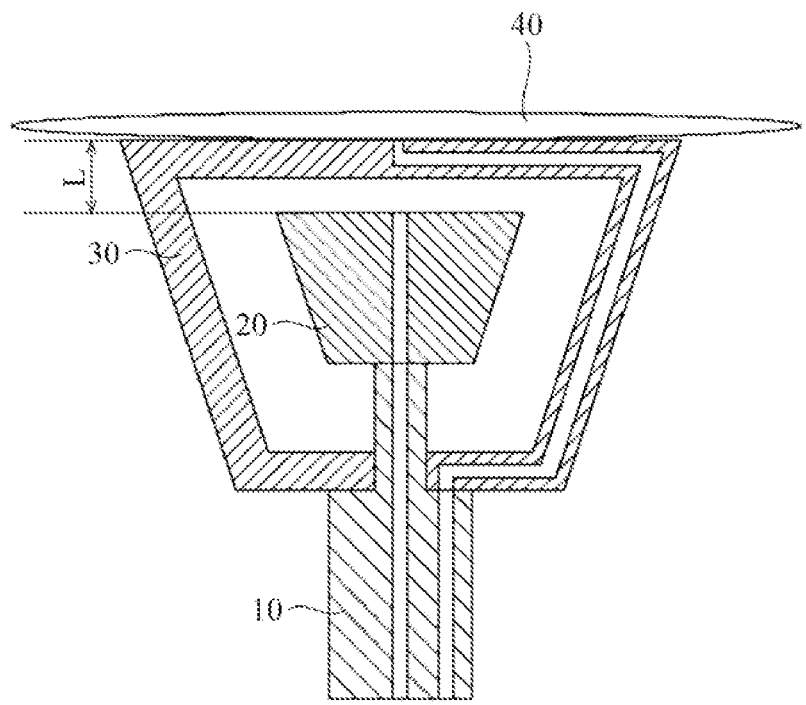
FIG. 10 is a schematic operating view of a second carrier stage of a carrier component in the embodiments of the present disclosure.
Figure 11:
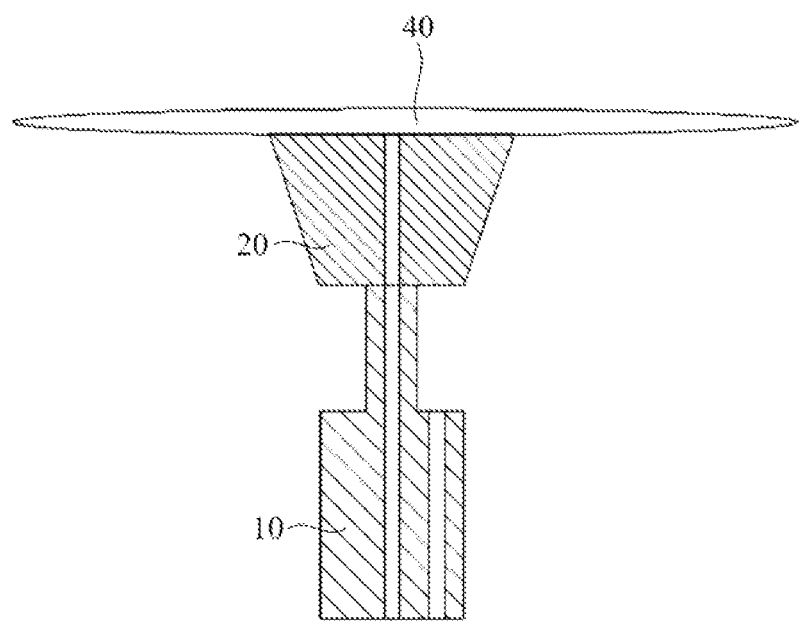
FIG. 11 is a schematic operating view of a first carrier stage of a carrier component in the embodiments of the present disclosure.

Referring to FIG. 10 to FIG. 11, when the carrier component in the embodiments of the present disclosure is used, the first carrier stage 20 is mounted on the supporting pillar 10, and at least two casings are then assembled outside the supporting pillar 10 and the first carrier stage 20 to form the second carrier stage 30; and the second carrier stage 30 is mounted on the supporting pillar 10 to enable the supporting pillar 10 to drive the first carrier stage 20 and the second carrier stage 30 to move. After the installation, there is a preset height difference L between the carrying end of the first carrier stage and the carrying end of the second carrier stage. The preset height difference L is less than or equal to 20 cm.

During use, as shown in FIG. 10, the wafer 40 is placed at the carrying end of the second carrier stage, and the wafer 40 is held and fixed by means of the second suction port. The driving device drives the supporting pillar 10 to move till the carrying end of the second carrier stage reaches a preset position, and then drives the supporting pillar 10 to rotate to enable the wafer 40 to synchronously rotate. Photoresist or developing liquid is sprayed to the center position of the wafer 40 through the nozzle to carrying out the coating or developing process.

It should be noted that when the carrier component is used, the photoresist or developing liquid may be firstly sprayed to the center position of the wafer 40 through the nozzle, and the wafer 40 is then rotated to coat the surface of the entire wafer 40 with the photoresist or developing liquid. That is, the order of nozzle coating and wafer rotation can be adjusted as required, and there is no limitation.

Referring to FIG. 11, when the second carrier stage 30 is abraded or damaged, the second carrier stage 30 is disassembled to separate the at least two casings, and the through mounting hole is split, so that the second carrier stage 30 can be removed from the supporting pillar 10 to expose the first carrier stage 20 inside the second carrier stage 30. A controller control the first carrier stage 20 to move towards a direction away from the driving device, and the moving distance of the first carrier stage 20 is equal to the preset height different L. That is, the carrying end of the first carrier stage moves to the original height of the carrying end of the second carrier stage, and the wafer 40 is then placed and held on the first carrier stage 20 to continue to carry out the coating or developing process.

In addition, when the first carrier stage 20 is abraded or damaged, the second carrier stage 30 is assembled outside the first carrier stage 20 and part of the supporting pillar 10 and is fixedly connected with the supporting pillar 10. The controller control the second carrier stage 30 to move along a direction towards the driving device, and the moving distance of the second carrier stage 30 is equal to the preset height different L. That is, the carrying end of the second carrier stage moves to the original position of the carrying end of the second carrier stage, and the wafer 40 is then placed and held on the second carrier stage 30 to continue to carry out the coating or developing process.

In the embodiments of the present disclosure, when the coating developer device is in a production cycle, if the second carrier stage 30 needs to be replaced, after the second carrier stage 30 is removed, the first carrier stage 20 inside the second carrier stage 30 can be used to continue to carry the wafer for production. When the first carrier stage 20 needs to be replaced, the second carrier stage 30 may be mounted outside the first carrier stage 20 to continue to carry the wafer by means of the first carrier stage 20 for production. As such, the installation or removal time of the first carrier stage 20 is saved, the time for stopping to replace the carrier component can be reduced, the production efficiency of the wafer 40 is improved, and the yield is then increased. In a maintenance cycle of the coating developer device, the first carrier stage 20 and the second carrier stage 30 may be replaced, and spare parts are prepared.

In the embodiments of the present disclosure, the carrier component includes the supporting pillar 10, the first carrier stage 20 and the second carrier stage 30; the first carrier stage 20 and the second carrier stage 30 are fixedly mounted on the supporting pillar 10 respectively, so that the first carrier stage 20 and the second carrier stage 30 can synchronously move with the supporting pillar 10; the second carrier stage 30 is provided with the accommodating cavity 31 and the through mounting hole 32; the through mounting hole 32 is in communication with the accommodating cavity 31; the first carrier stage 20 is arranged in the accommodating cavity 31, i.e., the first carrier stage 20 is located in the accommodating cavity 31 inside the second carrier stage 30; the second carrier stage 30 includes at least two casings; these casings are assembled to form the through mounting hole 32 matched with the supporting pillar 10 and the accommodating cavity 31 surrounding the first carrier stage 20; and these casings are detachably connected. By means of splitting the second carrier stage 30 into at least casings, the first carrier stage 20 can be exposed after the second carrier stage 30 is removed from the supporting pillar 10. When the second carrier stage 30 is damaged, the second carrier stage 30 can be removed without removing the first carrier stage 20 to expose the first carrier stage 20, and the first carrier stage 20 continues to carry the wafer, so that the installation time of the first carrier stage 20 is saved, the time for stopping to replace the carrier component is reduced, and the production efficiency of the wafer 40 is improved. In addition, when the first carrier stage 20 is damaged, the at least two casings are assembled into the second carrier stage 30 without removing the first carrier stage 20, so that the second carrier stage 30 can be mounted outside the first carrier stage 20 and part of the supporting pillar 10, and the second carrier stage 30 continues to carry the wafer 40, thereby saving the removal time of the first carrier stage 20, reducing the downtime for replacing the carrier component, and further improving the production efficiency of the wafer 40.

All the embodiments or implementation modes in the specification are described in a progressive manner. Contents mainly described in each embodiment are different from those described in other embodiments. Same or similar parts of all the embodiments refer to each other.

Those skilled in the art should understand that in the disclosure of the present disclosure, the orientation or positional relationships indicated by terms "longitudinal", "lateral", "upper", "lower", "front", "rear", "left", "right" and "vertical", "horizontal", "top", "bottom", "inner", "outer", etc. are based on the orientations or positional relationships shown in the drawings, which are only for the convenience of describing the present disclosure and simplifying the description, rather than indicating or implying that the system or element referred to must have a specific orientation or be constructed and operated in a specific orientation, so the above terms should not be construed as limiting the present disclosure.

In the description of the present specification, descriptions of the reference terms such as "one embodiment," "some embodiments," "illustrative implementation modes," "examples," "specific examples," or "some examples" mean that specific features, structures, materials or characteristics described in connection with the embodiments or examples are included in at least one embodiment or example of the present disclosure. In the present specification, the schematic representations of the above terms do not necessarily refer to the same implementation mode or example. Moreover, the described specific features, structures, materials or characteristics may be combined in any one or more implementation modes or examples in an appropriate manner.

It should be finally noted that the various above embodiments are only used to describe the technical solutions of the present disclosure, and not intended to limit the present disclosure. Although the present disclosure has been described in detail with reference to the foregoing embodiments, those ordinarily skilled in the art should understand that they can still modify the technical solutions described in all the foregoing embodiments, or equivalently replace some or all of the technical features, and these modifications or replacements do not depart the essences of the corresponding technical solutions from the spirit and scope of the technical solutions of all the embodiments of the present disclosure.

The invention claimed is:

1. A carrier component, comprising
a supporting pillar, a first carrier stage fixedly mounted on the supporting pillar, and a second carrier stage fixedly mounted on the supporting pillar and located outside the first carrier stage, wherein
the second carrier stage is provided with an accommodating cavity and a through mounting hole in communication with the accommodating cavity;
the second carrier stage comprises at least two casings;
the at least two casings are assembled to form the through mounting hole matched with the supporting pillar and the accommodating cavity surrounding the first cater stage;
the at least two casings are detachably connected to one another;
a first conduit and a second conduit are arranged in the supporting pillar;
a carrying end of the first carrier stage is provided with a first suction port;
a first channel in communication with the first suction port is arranged in the first cater stage;
the first channel is in communication with the first conduit;
a carrying end of the second carrier stage is provided with a second suction port;
a second channel in communication with the second suction port is arranged in the second carrier stage;
the second channel is not in communication with the accommodating cavity; and
the second channel is in communication with the second conduit.

2. The carrier component of claim 1, wherein
the second cater stage is in a shape of a truncated cone;
a first end of the second carrier stage that has a first diameter is the carrying end of the second carrier stage; and
a second end of the second carrier stage that has a second diameter smaller than the first diameter is provided with the through mounting hole.

3. The carrier component of claim 2, wherein
the first diameter of the first end of the second carrier stage is 40 to 75 cm;
the second diameter of the second end of the second carrier stage is 30 to 60 cm; and
a height of the second carrier stage is 50 to 80 cm.

4. The carrier component of claim 1, wherein
the second carrier stage is formed by assembling the at least two casings; each of the at least two casings is provided with a notch; and
the notch of each of the at least two casings forms the through mounting hole.

5. The carrier component of claim 4, wherein
the through mounting hole is provided with an internal thread;
the supporting pillar is provided with an external thread cooperating with the internal thread; and
the second carrier stage is in threaded connection with the supporting pillar.

6. The carrier component of claim 1, wherein
the at least two casings are snapped with each other to form the second carrier stage, or the at least two casings are fixed to each other through a hoop.

7. The carrier component of claim 1, wherein the second channel is located in a casing wall of one of the at least two casings.

8. The carrier component of claim 1, wherein
the first carrier stage is in a shape of a truncated cone;
a third end of the first carrier stage that has a third diameter is the carrying end of the first carrier stage; and
a fourth end of the first carrier stage that has a fourth diameter smaller than the third diameter is in contact with the supporting pillar.

9. The carrier component of claim 8, wherein the third diameter of the third end of the first carrier stage is 15 to 50 cm;
the fourth diameter of the fourth end of the first carrier stage is 10 to 45 cm; and
a height of the first carrier stage is 30 to 50 cm.

10. The carrier component of claim 1, wherein
the supporting pillar comprises a first cylinder and a second cylinder;
one end of the first cylinder is connected with the first carrier stage; and
a second end of the first cylinder is connected with the second cylinder.

11. The carrier component of claim 10, wherein
a diameter of the first cylinder is less than a diameter of the second cylinder; and
an end of the second carrier stage provided with the through mounting hole is in contact with a step surface formed by the first cylinder and the second cylinder.

12. The carrier component of claim 2, wherein
the second carrier stage is formed by assembling the at least two casings;
each of the at least two casings is provided with a notch; and
the notch of each of the at least two casings forms the through mounting hole.

13. The carrier component of claim 3, wherein
the second carrier stage is formed by assembling the at least two casings;
each of the at least two casings is provided with a notch; and
the notch of each of the at least two casings forms the through mounting hole.

14. The carrier component of claim 2, wherein
the supporting pillar comprises a first cylinder and a second cylinder;
one end of the first cylinder is connected with the first carrier stage; and
a second end of the first cylinder is connected with the second cylinder.

15. The carrier component of claim 3, wherein
the supporting pillar comprises a first cylinder and a second cylinder;
one end of the first cylinder is connected with the first carrier stage; and a second end of the first cylinder is connected with the second cylinder.

16. A coating developer device, comprising
a carrier component, a driving device connected with the carrier component and configured to drive the carrier component, and a vacuumizing device, wherein
the carrier component comprises a supporting pillar, a first carrier stage fixedly mounted on the supporting pillar, and a second carrier stage fixedly mounted on the supporting pillar and located outside the first carrier stage,
the second carrier stage is provided with an accommodating cavity and a through mounting hole in communication with the accommodating cavity;
the second carrier stage comprises at least two casings;
the at least two casings are assembled to form the through mounting hole matched with the supporting pillar and the accommodating cavity surrounding the first carrier stage;
the at least two casings are detachably connected to one another a first conduit and a second conduit are arranged in the supporting pillar;
a carrying end of the first carrier stage is provided with a first suction port;
a first channel in communication with the first suction port is arranged in the first carrier stage;
the first channel is in communication with the first conduit;
a carrying end of the second carrier stage is provided with a second suction port;
a second channel in communication with the second suction port is arranged in the second carrier stage;
the second channel is not in communication with the accommodating cavity;
the second channel is in communication with the second conduit; and
the vacuumizing device is in communication with the first suction port and the second suction port of the carrier component.

17. The coating developer device of claim 16, wherein the second channel is located in a casing wall of one of the at least two casings.

18. The coating developer device of claim 16, wherein
the second carrier stage is in a shape of a truncated cone;
a first end of the second carrier stage that has a first diameter is the carrying end of the second carrier stage; and
a second end of the second carrier stage that has a second diameter smaller than the first diameter is provided with the through mounting hole.

19. The coating developer device of claim 18, wherein
the first diameter of the first end of the second carrier stage is 40 to 75 cm;
the second diameter of the second end of the second carrier stage is 30 to 60 cm; and
a height of the second carrier stage is 50 to 80 cm.

20. The coating developer device of claim 16, wherein
the second carrier stage is formed by assembling the at least two casings;
each of the at least two casings is provided with a notch; and
the notch of each of the at least two casing forms the through mounting hole.

* * * * *